United States Patent
Wu et al.

(10) Patent No.: US 7,754,530 B2
(45) Date of Patent: Jul. 13, 2010

(54) THERMAL ENHANCED LOW PROFILE PACKAGE STRUCTURE AND METHOD FOR FABRICATING THE SAME

(75) Inventors: Enboa Wu, Taipei (TW); Shou-Lung Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/388,191

(22) Filed: Feb. 18, 2009

(65) Prior Publication Data

US 2009/0155954 A1     Jun. 18, 2009

Related U.S. Application Data

(62) Division of application No. 11/301,903, filed on Dec. 13, 2005, now Pat. No. 7,511,365.

(30) Foreign Application Priority Data

Apr. 21, 2005   (TW) .................. 94112784 A

(51) Int. Cl.
*H01L 21/44* (2006.01)
(52) U.S. Cl. ............... 438/108; 438/123; 257/E21.499; 257/E21.505
(58) Field of Classification Search ............... 438/108, 438/110, 123, 127; 257/E21.499, E21.505
See application file for complete search history.

(56) References Cited

U.S. PATENT DOCUMENTS

| 5,567,657 A | 10/1996 | Wojnarowski et al. |
| 5,703,400 A | 12/1997 | Wojnarowski et al. |
| 6,159,767 A | 12/2000 | Eichelberger |
| 6,242,282 B1 | 6/2001 | Fillion et al. |
| 6,429,047 B1 * | 8/2002 | Huang .................. 438/108 |
| 6,506,632 B1 | 1/2003 | Cheng et al. |
| 6,590,291 B2 | 7/2003 | Akagawa |
| 6,730,991 B1 | 5/2004 | Douglas |
| 2005/0094383 A1 | 5/2005 | Liu |
| 2006/0108146 A1 | 5/2006 | Wu et al. |
| 2006/0118931 A1 | 6/2006 | Ho et al. |

FOREIGN PATENT DOCUMENTS

CN          1304174       7/2001

* cited by examiner

*Primary Examiner*—Quoc D Hoang
(74) *Attorney, Agent, or Firm*—Volpe and Koenig PC

(57) ABSTRACT

A thermal enhanced low profile package structure and a method for fabricating the same are provided. The package structure typically includes a metallization layer with an electronic component thereon which is between two provided dielectric layers. The metallization layer as well as the electronic component is embedded and packaged while the substrates are laminated via a lamination process. The fabricated package structure performs not only a superior electric performance, but also an excellent enhancement in thermal dissipation.

9 Claims, 16 Drawing Sheets

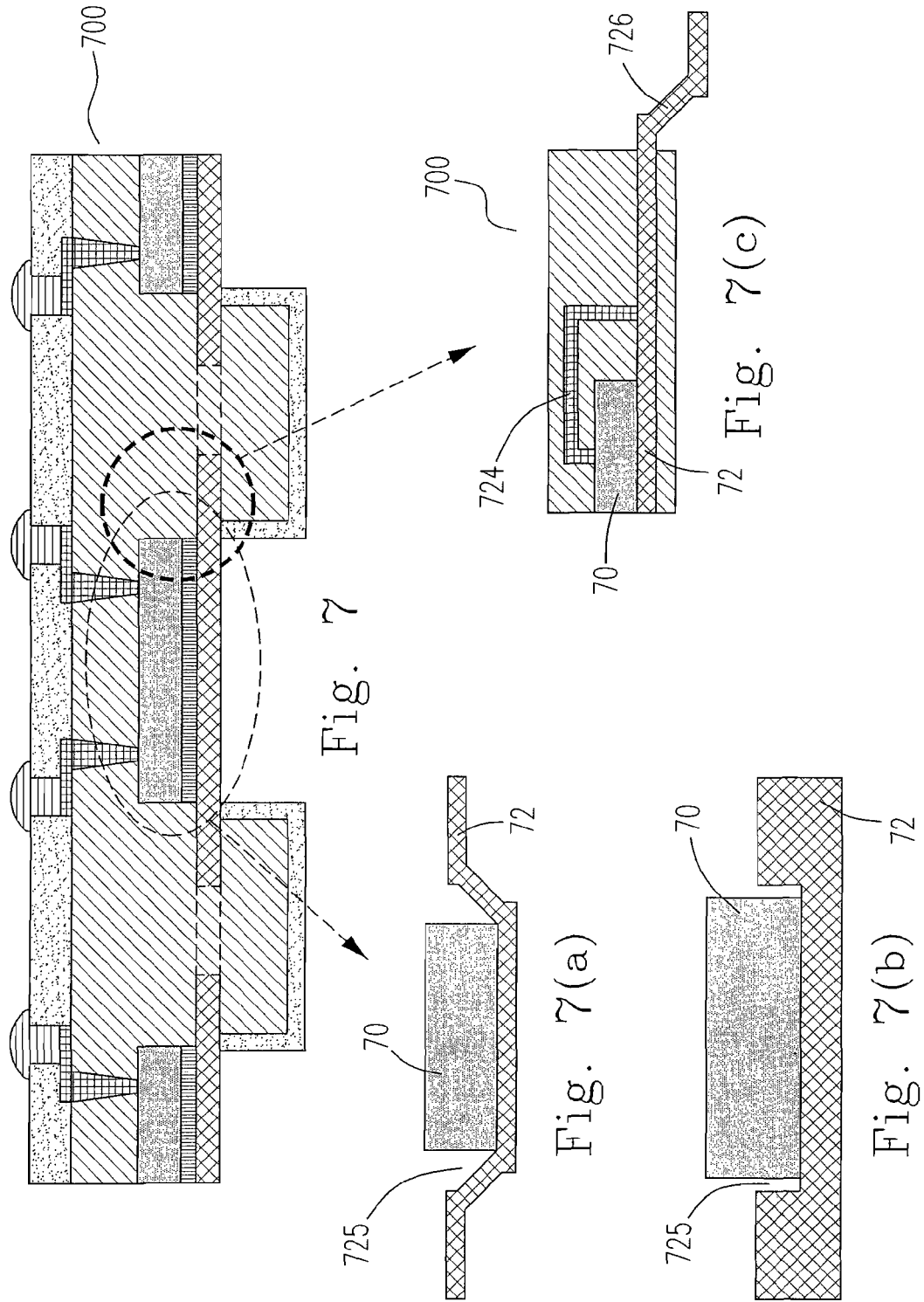

THERMAL ENHANCED LOW PROFILE PACKAGE STRUCTURE AND METHOD FOR FABRICATING THE SAME

FIELD OF THE INVENTION

The present invention relates to an electronic package structure and a method for fabricating the electronic package structure, and more particularly, to a thermal enhanced low profile electronic package structure and a method for fabricating it.

BACKGROUND OF THE INVENTION

For the trend toward the miniaturization for the electronic device, the electronic manufacturers involved in the technology have made more and more efforts in manufacturing a portable and miniature electronic device with a great functionality and operation density. Since an electrical connection between the circuit in the package structure for an electronic device and the integrated circuit (IC) chip applied therein must be well made for being operated with a high efficiency, an increasing development is also necessary for the electronic package technology to provide a package structure having the improved functionalities of electricity conducting, signal transferring, thermal dissipating and circuitry protecting.

The miniaturization for the electronic device implies that the interconnection density of a circuit needs to be further increased. Nowadays, there are lots of disclosures discussing the package structure for a high density circuit as well as the fabrication method therefor. For example, regarding the U.S. Pat. No. 6,242,282, a high density circuit chip package and the fabrication method therefor are disclosed therein. Please refer to FIG. 1, which is a sectional side view schematically illustrating the structure produced by such method. The circuit chip 10 and the chip pad 14 thereof are located on a first surface of the interconnect layer 12, where the interconnect layer 12 has vias 122 and metallic wiring 124 pre-formed therein, and the circuit chip 10 adjoins a specific via 122. The substrate molding material 18 is formed around the circuit chip 10 through the application of adhesive layer 16, so that the circuit chip package 1 is completely fabricated.

As for the U.S. Pat. No. 5,567,657 as well as the U.S. Pat. No. 5,703,400, the fabrication and the structure of two-sided molded circuit modules with flexible interconnect layers are also respectively disclosed therein. For such fabrication, the molding material is inserted between the flexible interconnect layers for encapsulating the respective chips. Subsequently, vias in the flexible interconnect layers are formed to extend to the selected chip pads, and a pattern of electrical conductors is applied and extends over the flexible interconnect layers and into the vias to couple the selected ones of the chip pads, so as to fabricate the package structure.

In addition, a novel structure of the electronic package and a method for fabricating the same are also provided by the applicant, i.e. the US Patent Publication Number 2006/0237827 filed on Dec. 13, 2005. The provided method relates to a bumpless process for an organic substrate, where the electronic component is embedded between two substrates by means of the lamination process. When the substrate is fabricated, the electronic component thereon is also wired and packaged at the same time. Such method is advantageous in the provision of a simplified process and a package structure of greater performance, and the structure of the electronic package fabricated thereby is efficiently miniaturized since there needs no core layer and bump configured therein. Besides, since there is no additional interface between the die and the patterning layer in the package structure and the intensity of the signal is not reduced while being transmitted therethrough, the electrical performance thereof is superior.

The above-mentioned conventional techniques regarding the high density circuit chip package striature and the miniaturized electronic package structure sufficiently meet the demands for circuit density improvement and structure miniaturization. Nevertheless, there still exists an important issue worthy to be mentioned in view of the thermal dissipation inside the package structure.

For preventing the performance of the electronic device from the thermal effect caused by signal transmission, a thermal enhanced low profile package structure and the method for fabricating the same are provided in the present invention. Through the present invention, the fabricated package structure not only performs a superior electronic performance than the conventional ones, but also exhibits an excellent enhancement in thermal dissipation.

SUMMARY OF THE INVENTION

In accordance with a first aspect of the present invention, an electronic package structure is provided. The provided electronic package structure includes a first dielectric layer having a first upper surface and a first lower surface, a second dielectric layer having a second upper surface and a second lower surface, a metallization layer partially located between the first lower surface and the second upper surface, at least an electronic component embedded between the first lower surface and the metallization layer by performing one selected from a group consisting of a lamination process, a spin coating process and a printing process on the first dielectric layer and the second dielectric layer, and plural conductive members passing through the first dielectric layer and connected to the electronic component.

According to the first aspect, the second dielectric layer further includes plural first recesses formed thereon, and the electronic component is located correspondingly to one of the first recesses.

Preferably, the electronic package structure further includes a patterning layer partially located on the first upper surface.

Preferably, the metallization layer includes a leadframe-like carrier having plural channels formed thereon, so as to divide said leadframe-like carrier into plural lead carriers.

Preferably, the electronic component is located correspondingly to one of the lead carriers.

Preferably, the electronic component is further fixed on the lead carriers via a metal wire.

Preferably, each of the lead carriers further includes a second recess formed thereon, and the electronic component is located in the second recess.

Preferably, the first dielectric layer is one selected from a group consisting of a resin coated copper-foil substrate, an ajinomoto build-up film substrate and a flexible substrate.

Preferably, the second dielectric layer and the first dielectric layer are made of the same material.

Preferably, the electronic component is one of an active electronic component and a passive electronic component.

Preferably, the active component is one selected from a group consisting of a die, a semiconductor, a transistor and an integrated circuit.

Preferably, the passive electronic component is one of a discrete passive electronic component and a built-in passive electronic component.

Preferably, the discrete passive electronic component is one selected from a group consisting of a capacitor, a resistor and an inductor.

Preferably, the built-in passive electronic component is made of one selected from a group consisting of a capacitance material, a resistance material and an inductance material.

Preferably, the electronic package structure further includes plural electronic components selected from a group consisting of an active electronic component, a passive electronic component and the combination thereof.

Preferably, the electronic package structure further includes plural balls on the patterning layer.

In accordance with a second aspect of the present invention, an electronic package structure is provided, which includes a dielectric layer, a leadframe-like carrier having plural channels formed thereon for dividing the leadframe-like carrier into plural lead carriers, at least an electronic component embedded between the dielectric layer and the leadframe-like carrier corresponding to the respective lead carriers by performing one selected from a group consisting of a lamination process, a spin coating process and a printing process on the dielectric layer and the leadframe-like carrier, and plural conductive members passing through the dielectric layer and connected to the electronic component.

In accordance with a third aspect of the present invention, a method for fabricating an electronic package structure is provided. The provided method includes steps of (a) providing a first dielectric layer, (b) providing a leadframe-like carrier on the first dielectric layer, wherein the leadframe-like carrier includes plural channels formed thereon for dividing the leadframe-like carrier into plural lead carriers, (c) providing an electronic component on one of the lead carriers, (d) providing a second dielectric layer on the electronic component so that the first dielectric layer and the electronic component are covered therewith and a sandwich structure is formed thereby, (e) performing a lamination process on the sandwich structure, so that the electronic component is embedded therein, (f) forming plural conductive members on the sandwich structure, wherein the conductive members pass through the second dielectric layer and are connected to the electronic component, and (g) patterning the sandwich structure.

Preferably, after the step (b), the method further includes a step of (b1) forming plural recesses on the respective lead carriers.

Preferably, the recesses are formed on the respective lead carriers by one of a punching process and an etching process in the step (b1).

Preferably, the electronic component is located in one of the recesses.

Preferably, the second dielectric layer is provided on the electronic component by a build-up process in the step (d).

Preferably, after the step (h), the method further includes a step of performing a solder mask process on the sandwich structure.

Preferably, after the step (h), the method further includes a step of performing a ball-mounting process on the sandwich structure.

In accordance with the third aspect, the method further includes a step of singulating the sandwich structure into the electronic package structure.

Preferably, each of the first dielectric layer and the second dielectric layer is one selected from a group consisting of a resin coated copper-foil substrate, an ajinomoto build-up film substrate and a flexible substrate.

The foregoing and other features and advantages of the present invention will be more clearly understood through the following descriptions with reference to the drawings, wherein:

BRIEF DESCRIPTION OF THE DRAWINGS

FIGS. 7 and 7(a) to 7(c) are diagrams illustrating the metallization layer and the leadframe-like carrier configured in the package structure according to the present invention.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
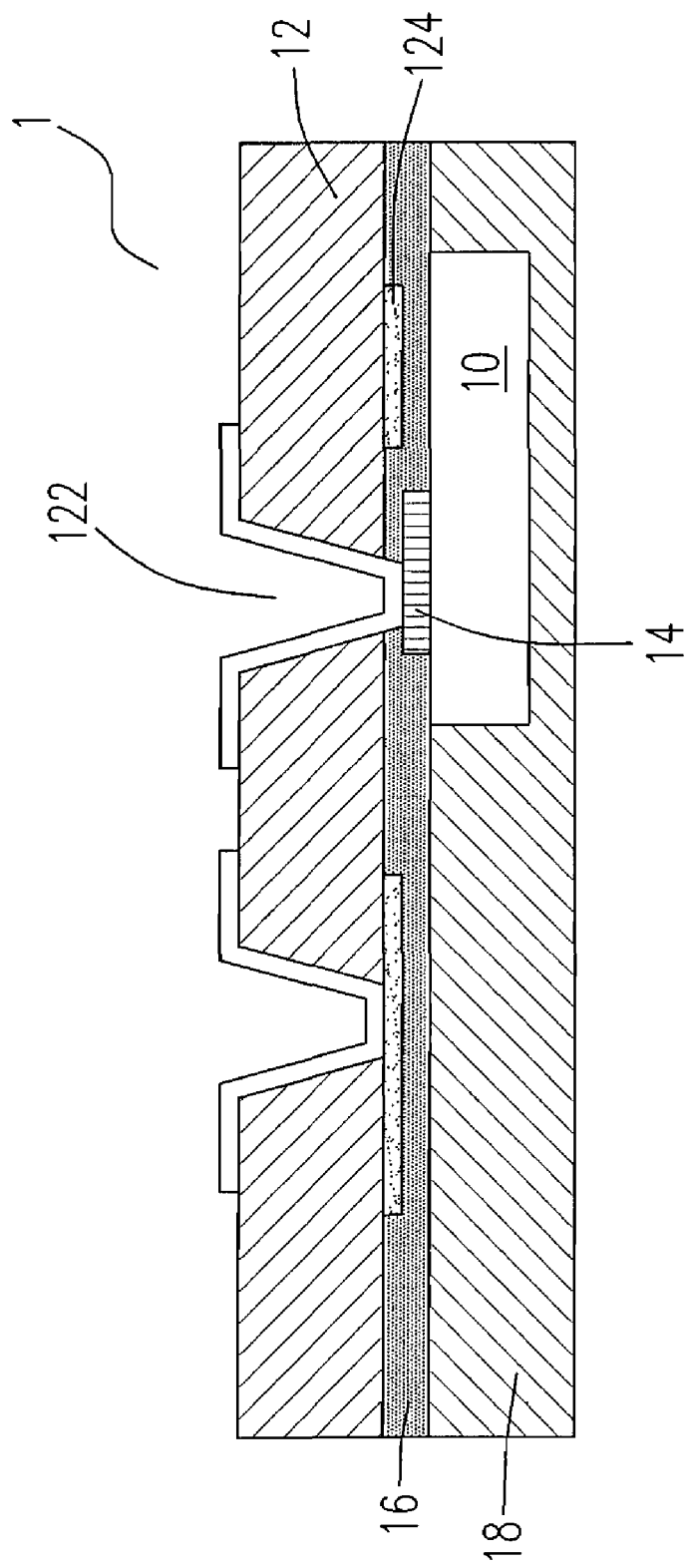
FIG. 1 is a diagram illustrating a conventional package structure according to the prior art.
Figure 2A:
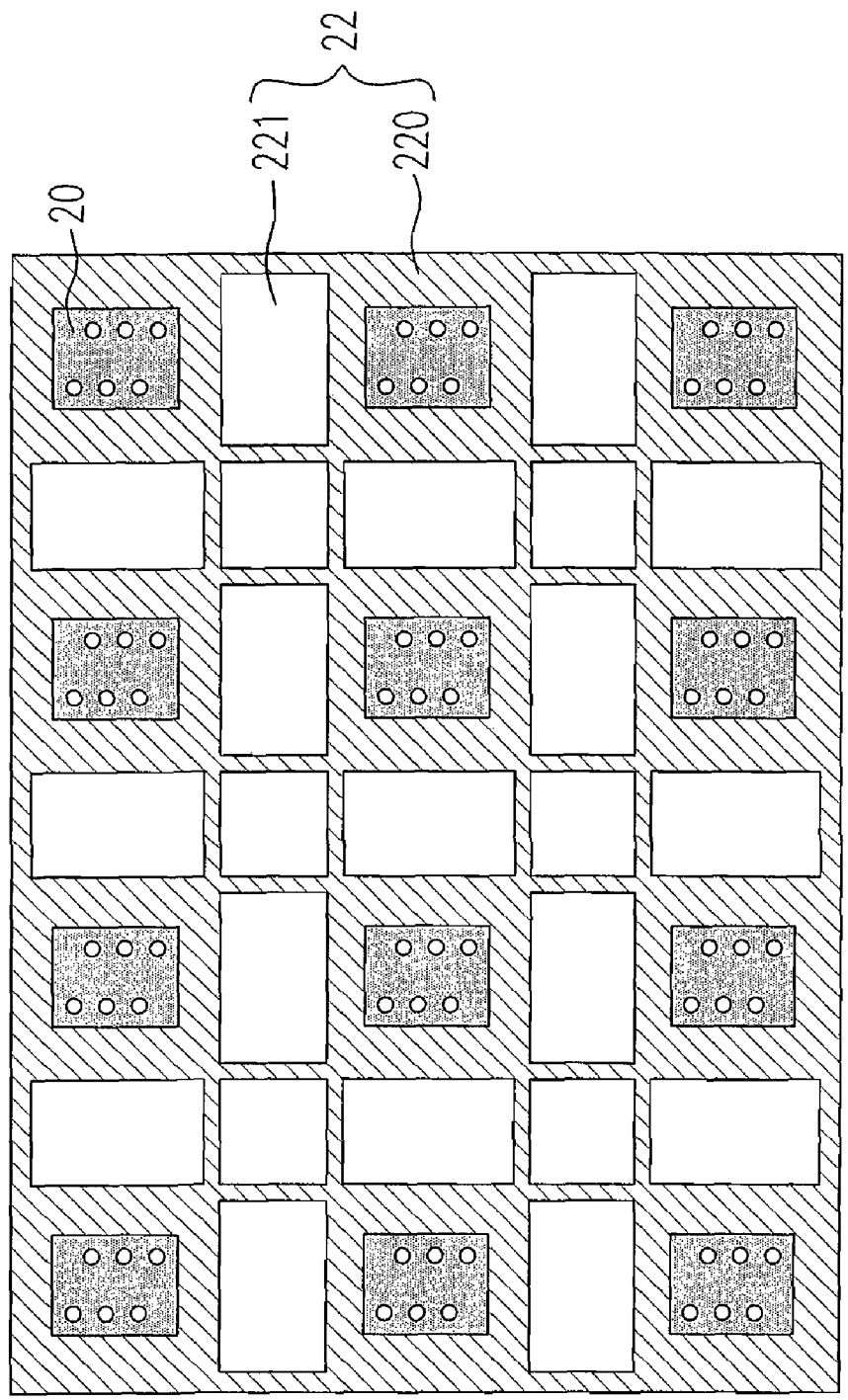
FIGS. 2(a) to 2(h) are diagrams schematically illustrating the method according to a preferred embodiment of the present invention.

Please refer to FIGS. 2(a) to 2(h), which schematically illustrate the method for fabricating the thermal enhanced low profile package structure of the present invention. First, the electronic component 20 to be packaged is placed on a provided leadframe-like carrier 22. The electronic component 20 may be a die. As shown in FIG. 2(a), there are plural channels 221 formed on the leadframe-like carrier 22, so that the leadframe-like carrier 22 is divided into plural lead carriers 220. The electronic component 20 is located correspondingly to one of the lead carriers 220.

Figure 2B:
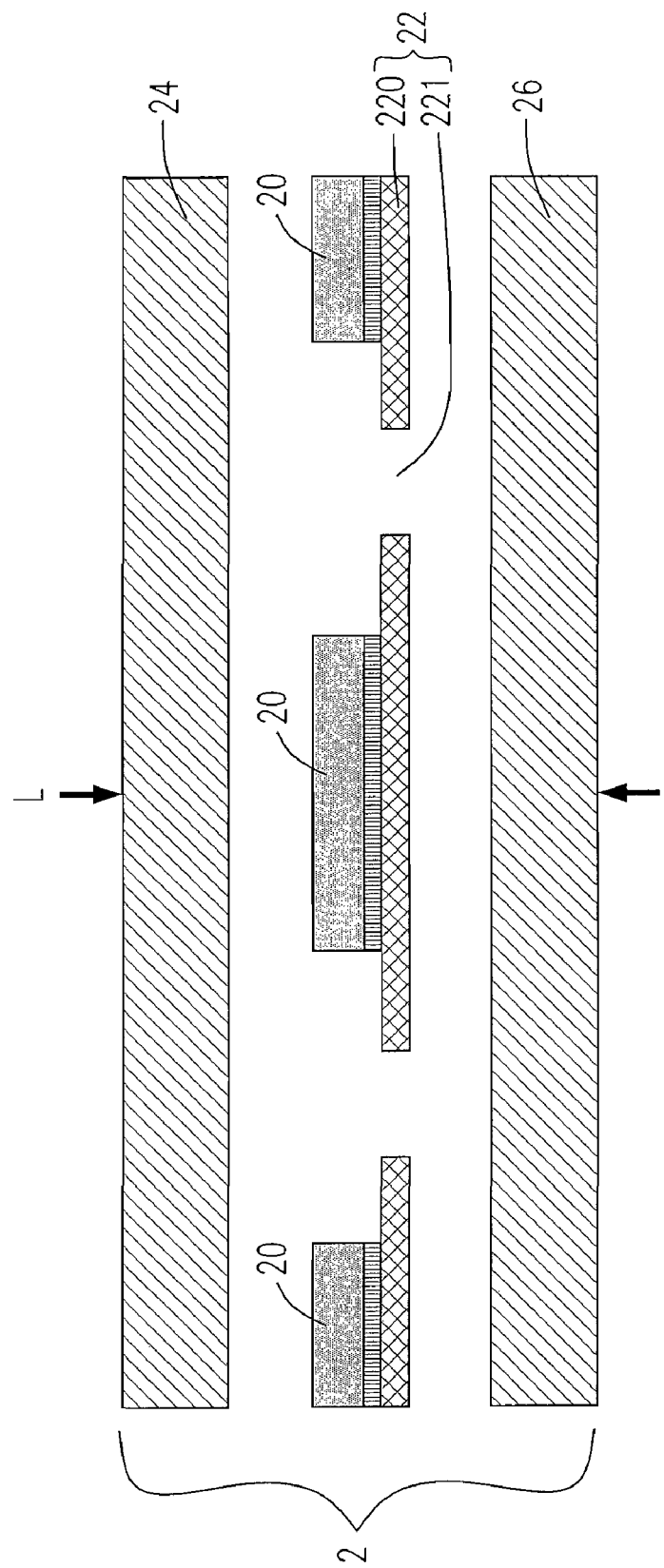

Then, a first dielectric layer 24 and a second dielectric layer 26 are provided on the respective outer surfaces of the electronic component 20 and the leadframe-like carrier 22, and therebetween the electronic component 20 as well as the leadframe-like carrier 22 are sandwiched in, so as to form a sandwich structure 2. In this case, the first dielectric layer 24 is made of dielectric material for the substrate as well as the second dielectric layer 26. A lamination process is then performed on the sandwich structure 2 in the direction L, as shown in FIG. 2(b). In addition to the lamination process, the spin coating process and the printing process are also alternatively adoptable.

Figure 2C:
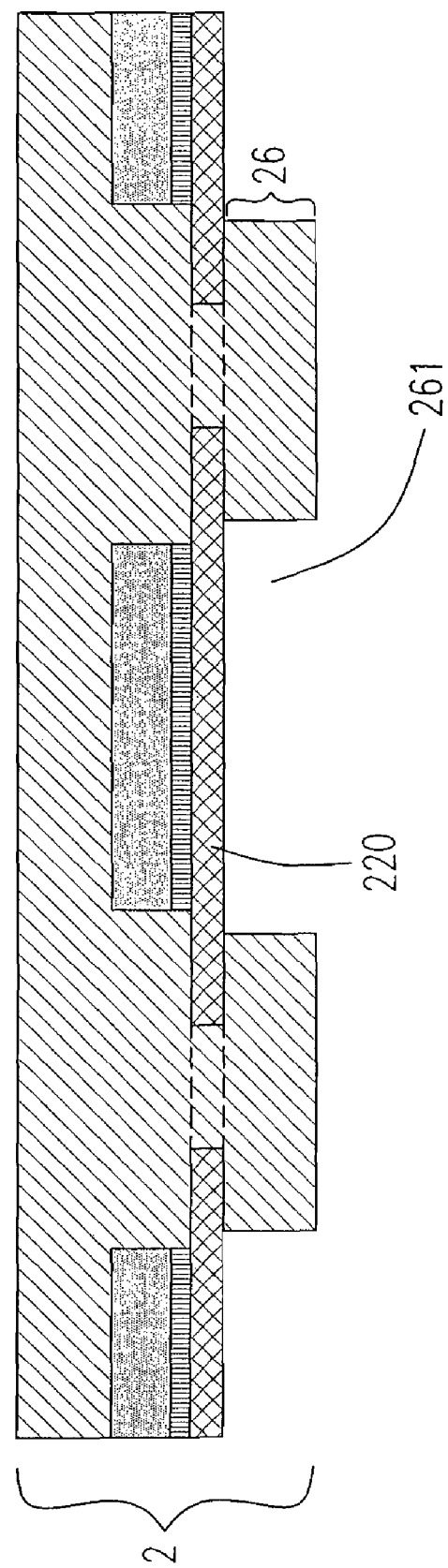

Subsequently, a portion of the second dielectric layer 26 of the laminated sandwich structure 2 is removed, so as to produce plural first recesses 261 thereon, and thereby the lead carriers 220 are exposed for thermal dissipation, as shown in FIG. 2(c).

Figure 2D:
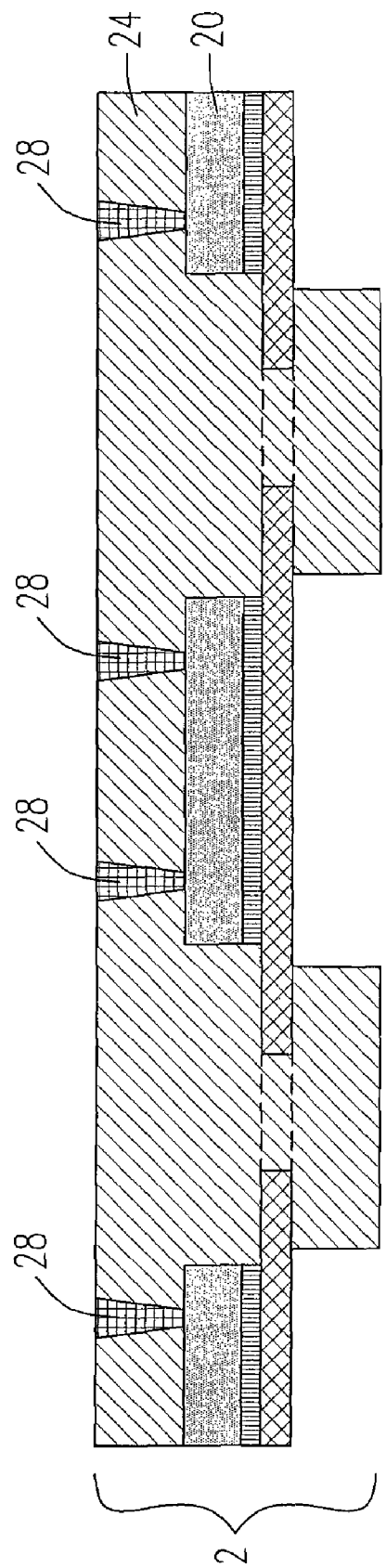

After that, plural vias are formed on the first dielectric layer 24 of the laminated sandwich structure. Typically, each of the UV laser process, the $CO_2$ laser process and the chemical etching process is adoptable for providing the plural vias running through the first dielectric layer 24 and being achieved to the electronic component 20. However, the UV laser process has more advantages than the others since a fine pitching is able to be achieved thereby. Hence the UV laser process is preferred in this case to fabricate the plural vias without damaging the structure therebelow. After being fabricated, the plural vias are filled with a conductive material, so as to produce a plurality of conductive members 28, as shown in FIG. 2(d).

Figure 2E:
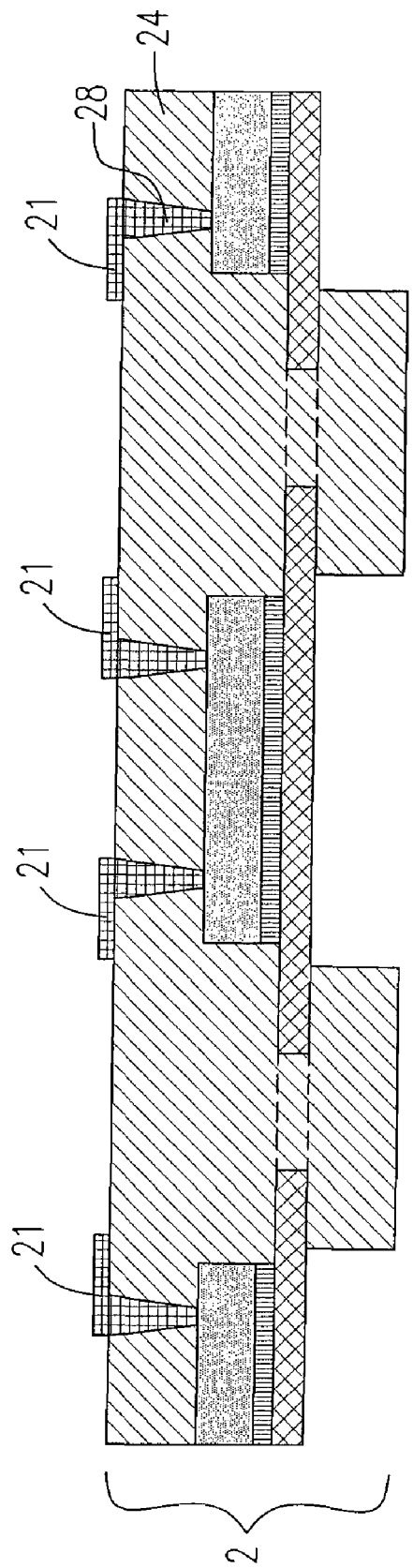

After the plurality of conductive members 28 are fabricated, the first dielectric layer 24 with the fabricated conductive members 28 is patterned, so that a patterning layer 21 is formed. The patterned sandwich structure 20 is further wired for having traces thereon, as shown in FIG. 2(e).

Figure 2F:
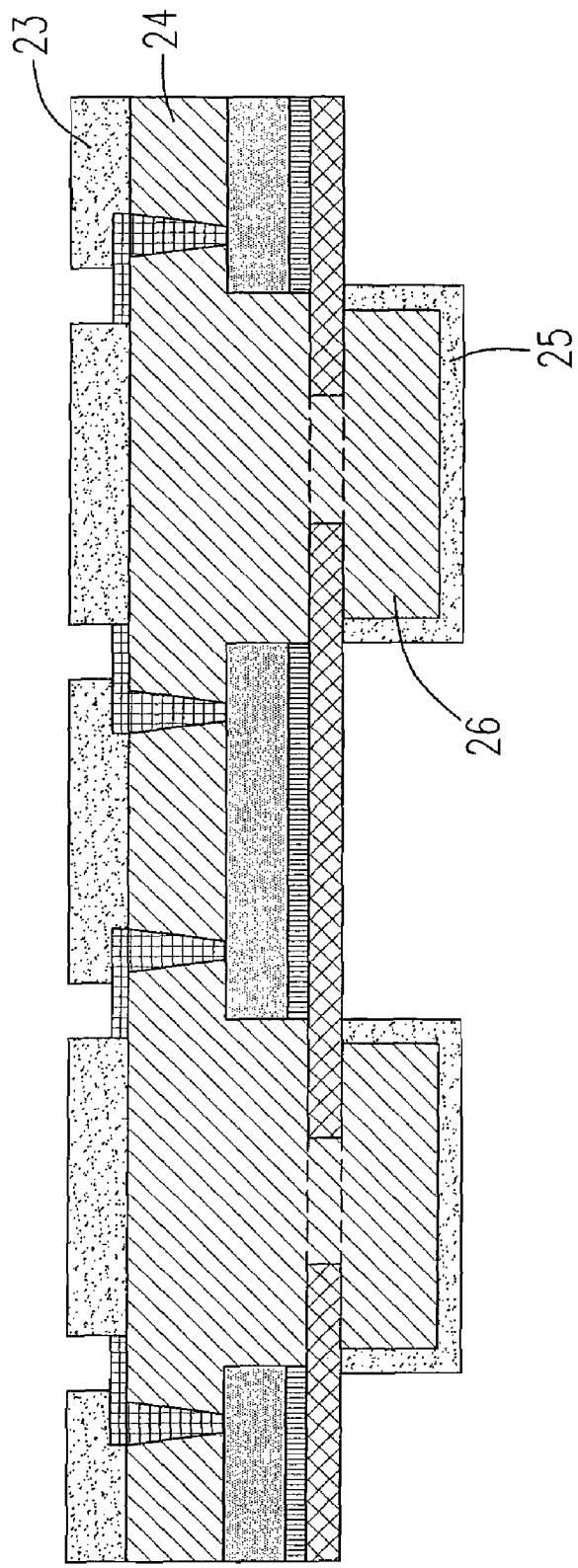

The thermal enhanced low profile package structure of the present invention is basically fabricated through the provided method. In order to provide a further protection for the fabricated package structure and the structure thereinside from suffering damages in the sequent processes, the method also includes a step of performing a known solder mask process on the package structure for providing a complete coverage protection thereon, where the solder masks 23 and 25 are respectively provided on the outer surfaces of the first and the second dielectric layers 24 and 26, as shown in FIG. 2(f).

Figure 2G:
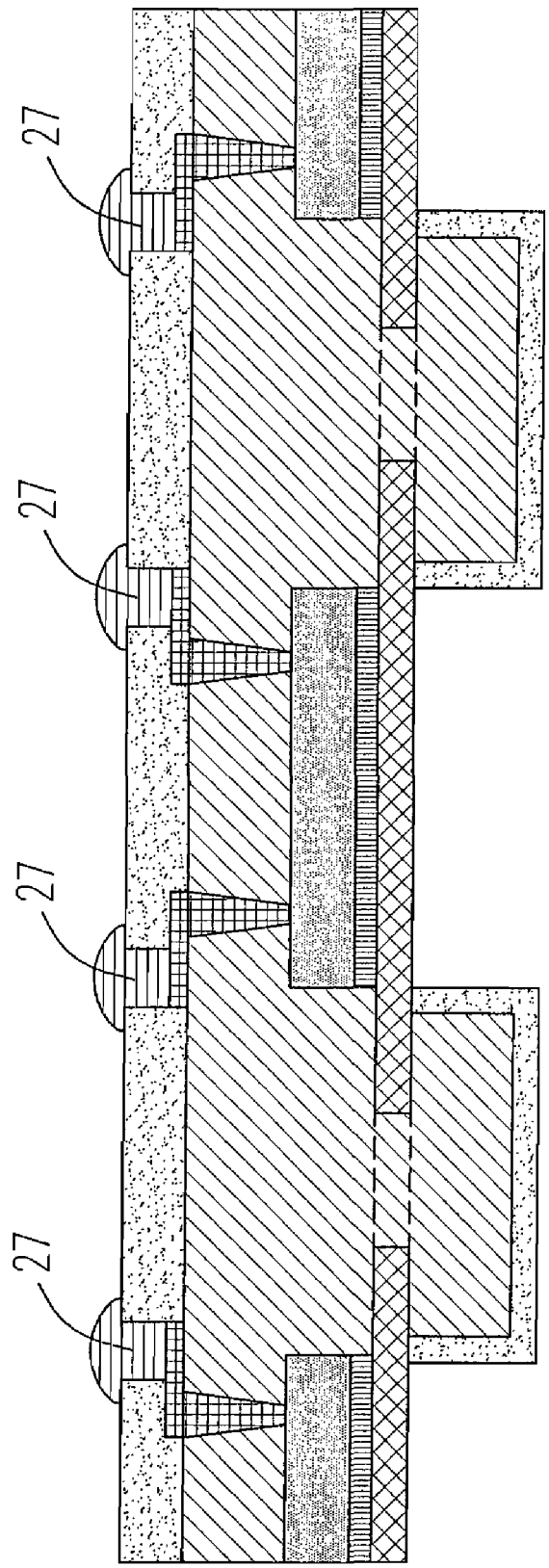
Figure 2H:
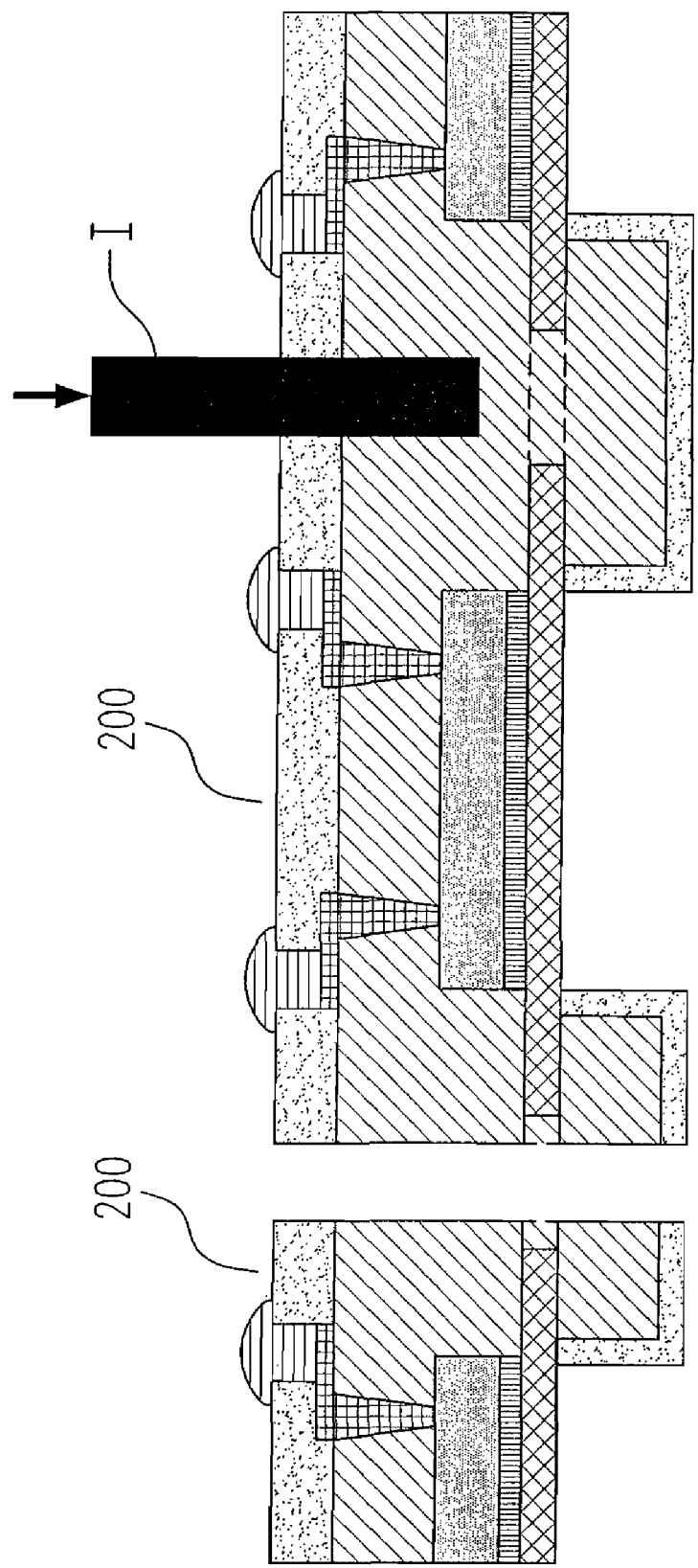

Moreover, for further remaining the pitch for the fabricated package structure, the method also includes a step of performing the ball mounting process thereon, so that a plurality of solder balls 27 are respectively formed on the predetermined positions on the package structure thereby as shown on FIG. 2(g). Finally, the package structure is isolated or singulated as required via the isolation apparatus I, and a single device 200 is hence fabricated as shown in FIG. 2(h).

In the present invention, the electronic component 20 is just placed on the lead carrier 220, but not bonded. Preferably, for avoiding the movement of the electronic component 20 caused by the surrounding fluctuation, the electronic component 20 may be bonded with the lead carrier 220 by such as wire bonding, whereby the electronic component 20 is connected with the lead carrier 220 through the metallic wiring which extends outside the package structure for connecting to other electronic devices.

Furthermore, the provided method is widely applicable for various dielectric materials, such as the RCC (Resin Coated Copper-foil) substrate, the ABF (Ajinomoto Build-up Film) substrate and the flexible substrate. The flexible substrate is always made of an organic material, such as the polyimide (PI), the polydimethylsiloxane (PDMS), the liquid crystal polymer (LCP) and the polyethylene terephthalate. The electronic device, which is fabricated from such a flexible organic substrate, will exhibit a good flexibility and are able to be applied more extensively.

Figure 3:
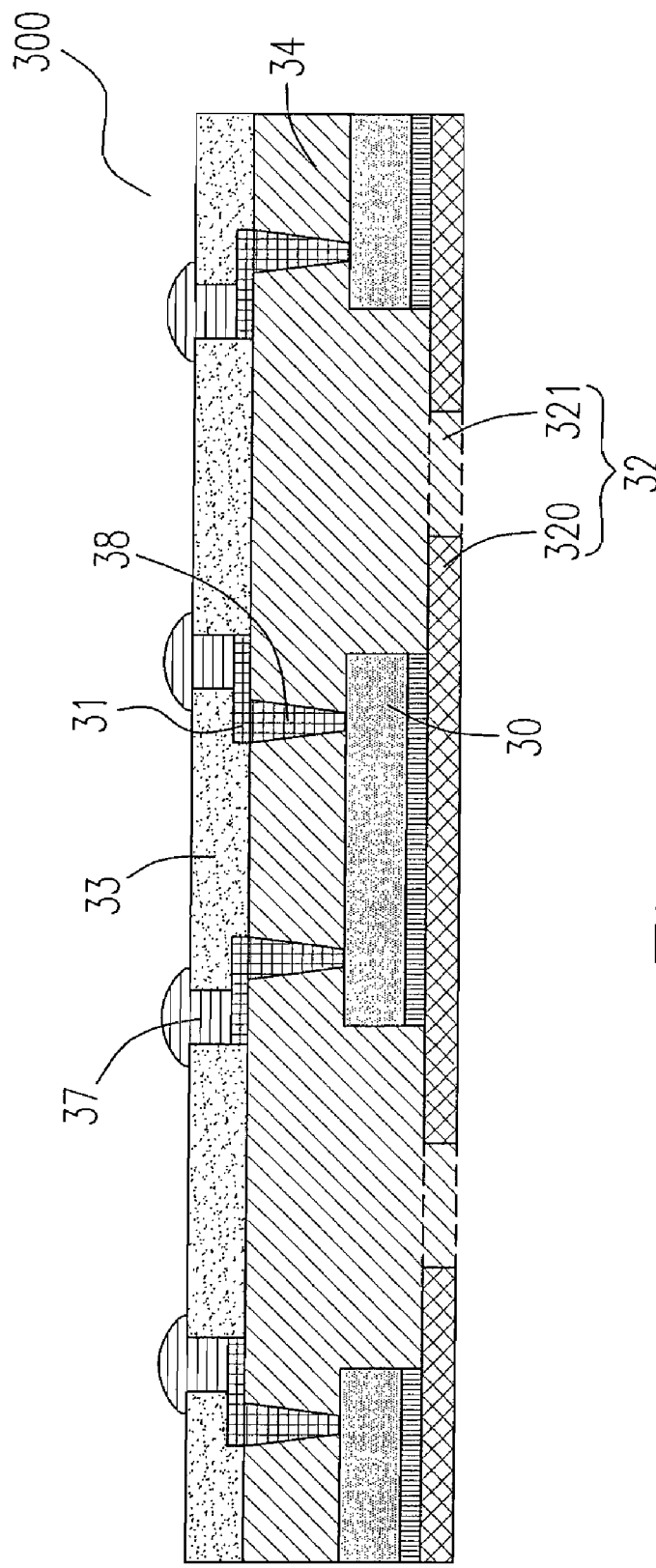
FIG. 3 is a diagram illustrating the package structure according to a first preferred embodiment of the present invention.

Please refer to FIG. 3, which is a diagram schematically illustrating the package structure according to a first preferred embodiment of the present invention. The package structure 300 includes an electronic component 30 that is pre-placed on a leadframe-like carrier 32. The leadframe-like carrier 32 is constructed by plural channels 321 and plural lead carriers 320 divided thereby, where the electronic component 30 is located on one of the lead carriers 322. The electronic component 30 is embedded in the package structure 300 by performing a lamination process on the dielectric layer 34 and the leadframe-like carrier 32. For further connecting the package structure 300 to an external circuit or electronic device, the package structure 300 also includes a plurality of conductive members 38, which pass through the dielectric layer 34 and connect to the electronic component 30 embedded within the package structure 300. On the respective outer surfaces of the conductive members 38 and the dielectric layer 34, a patterning layer 31 and plural solder balls 37 are provided for electrically connecting and remaining the pitch between the conductive members 38. In addition, portions of the respective outer surfaces of the dielectric layer 34 and the conductive members 38 are covered with a solder mask 33, so as to protect the component and the wiring inside the package structure 300 from suffering damages of moisture, contamination and heat caused by the sequent processes.

Figure 4:
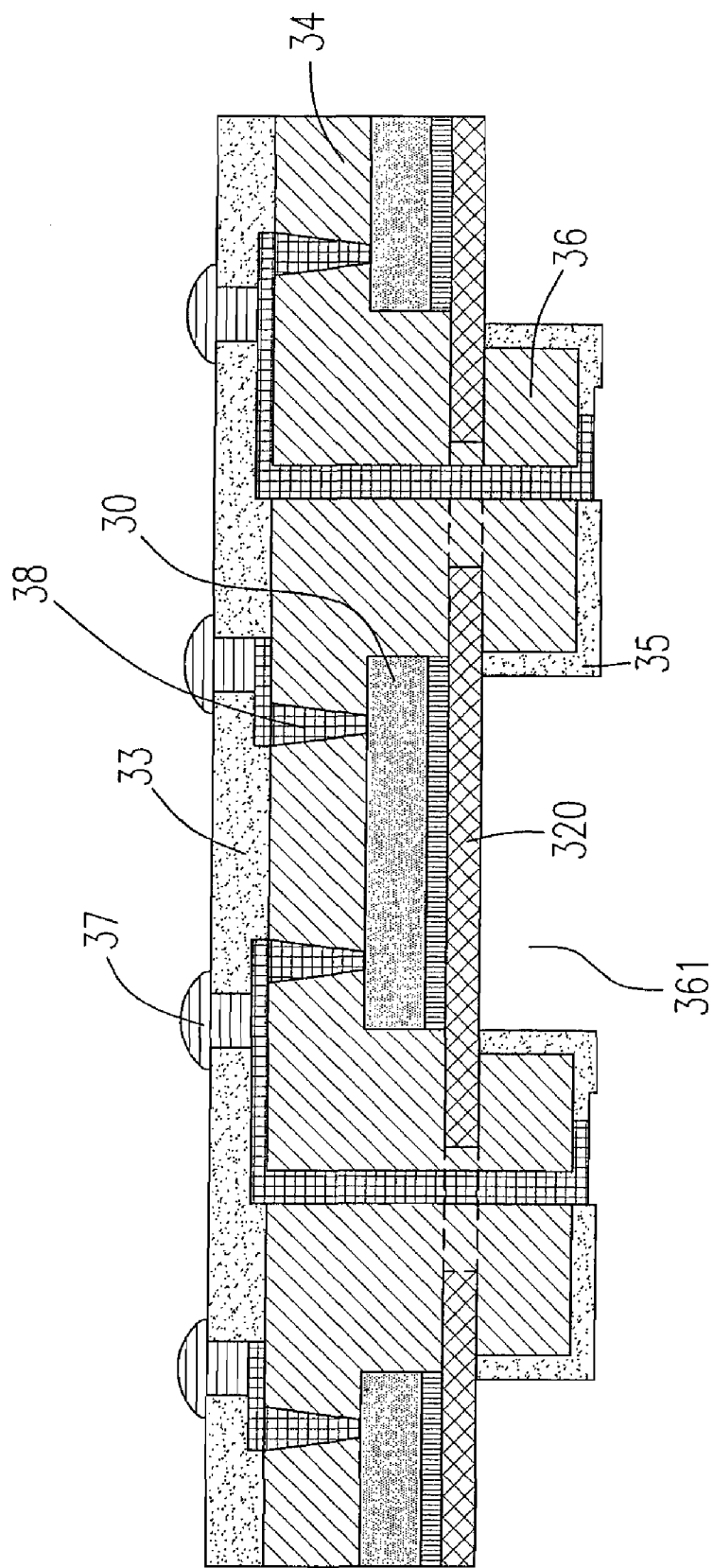
FIG. 4 is a diagram illustrating the package structure according to a second preferred embodiment of the present invention.

Please refer to FIG. 4, which is a diagram illustrating the package structure according to a second preferred embodiment of the present invention. In this embodiment, what is different from the package structure shown in FIG. 3 resides in that the electronic component 30 and the leadframe-like carrier 32 are embedded between the first dielectric layer 34 and the second dielectric layer 36 by performing a lamination process thereon. In addition, a portion of the second dielectric layer 36 is further removed, such that a plurality of first recesses 361 would be formed thereon for thermal dissipation, which benefits the thermal enhancement for the electronic device. Certainly, for protecting the second dielectric layer 36 of the package structure 300 from suffering damages of moisture and contamination, the outer surface of the second dielectric layer 36 is also covered with a solder mask 35.

Figure 5:
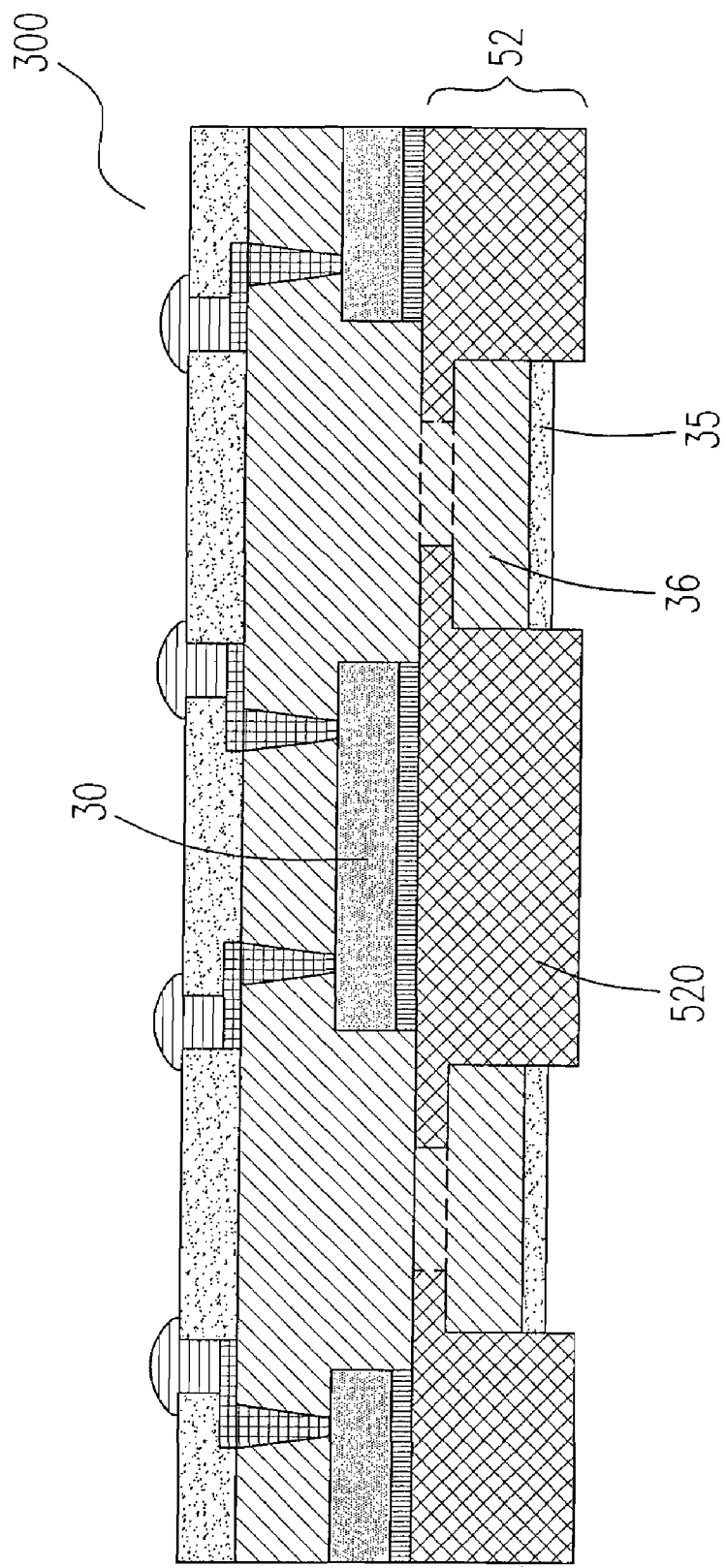
FIG. 5 is a diagram illustrating the package structure according to a third preferred embodiment of the present invention.

Please refer to FIG. 5, which is a diagram illustrating the package structure according to a third preferred embodiment of the present invention. In this case, the thermal enhancement for the electronic package structure would be further improved. The third embodiment is different from those shown in FIGS. 3 and 4 in that the leadframe-like carrier is replaced with a partially thickened metallization layer 52, where the electronic component 30 is located thereon. Furthermore, the thickened portion 520 of the metallization layer 52 protrudes over portions of the outer surface of the solder mask 35, so that the heat produced upon operation of the electronic component 30 would be directly dissipated therethrough.

Figure 6A:
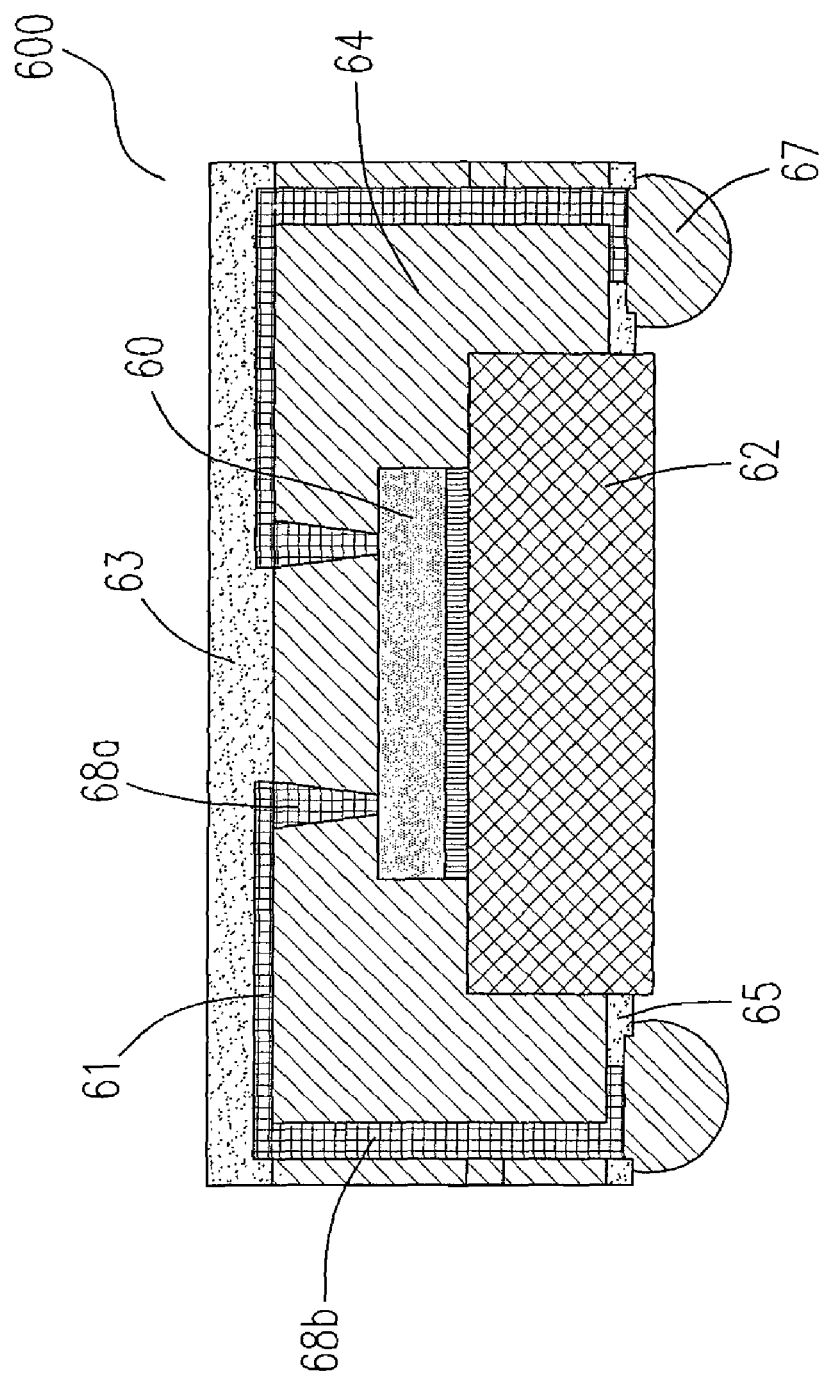
FIGS. 6(a) to 6(c) are diagrams illustrating the package structure according to a fourth preferred embodiment of the present invention.
Figure 6B:
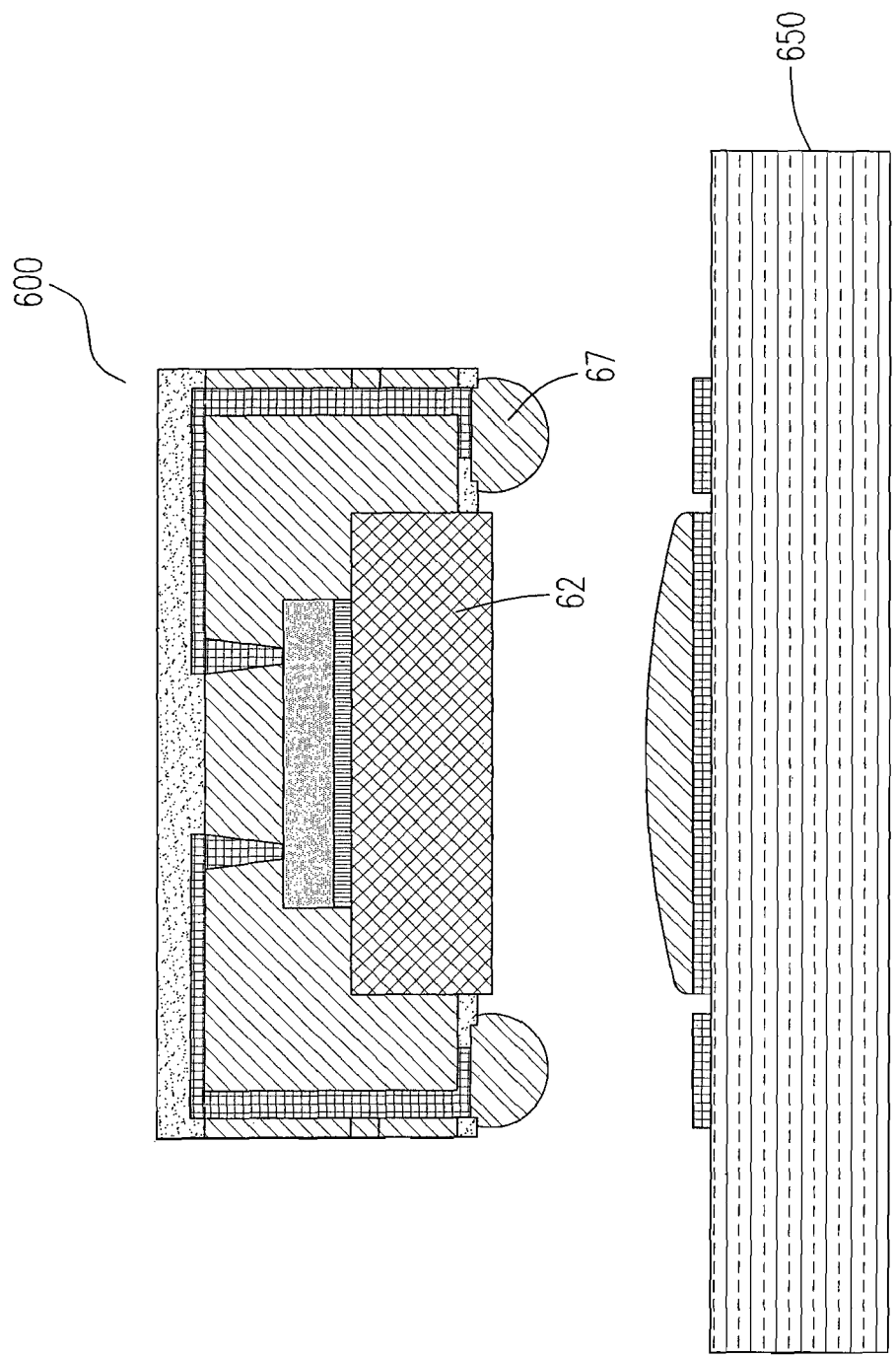
Figure 6C:
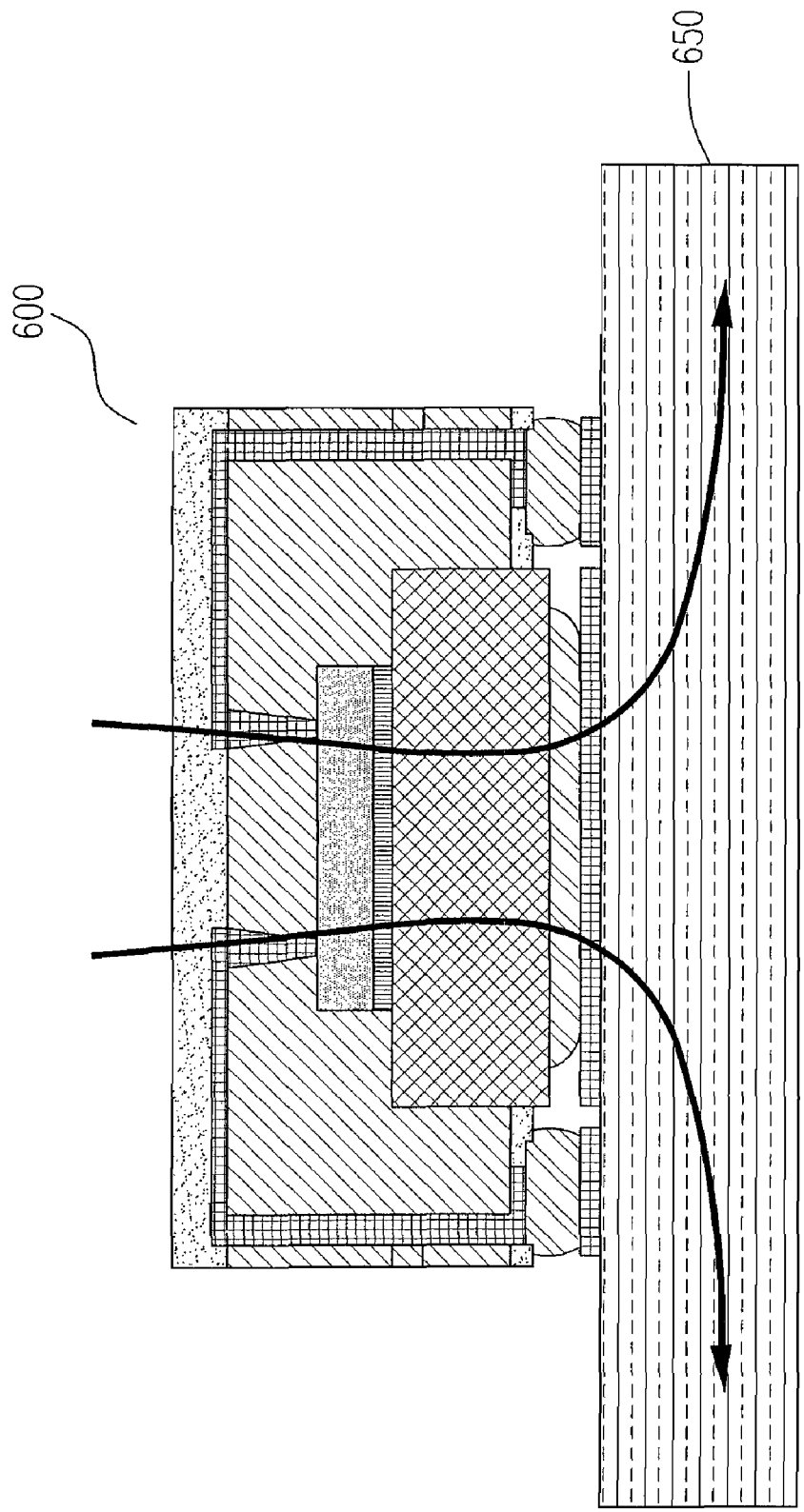

Please refer to FIGS. 6(a) to 6(c), which are diagrams illustrating the package structure according to a fourth preferred embodiment of the present invention. As for this package structure 600, the electronic component 60 is placed on the metallization layer 62 in advance, and then embedded between the dielectric layer 64 and the metallization layer 62 by laminating and moldering therefor. The package structure 600 further includes plural conductive members 68a and 68b, wherein the conductive member 68a connects to the electronic component 60 and the conductive member 68b passes through the dielectric layer 64 and connects to the solder balls 67 configured on the bottom of the electronic structure 600. Moreover, there is also a pattering layer 61 as well as the solder balls 67 configured on the outer side of the conductive members 68a and 68b for electrical connection to a further device. In addition, portions of the outer surfaces of the conductive members 68a and 68b and the dielectric layer 64 are also covered with a solder mask 63, so as to protect the package structure 600 from suffering damages of moisture, contamination and heat caused by the sequent processes.

Preferably, the solder balls 67 are formed on the outer surface near the metallization layer 62, whereby the package structure 600 is further connected to the substrate 650 for a system or a quasi-system, as shown in FIGS. 6(b) and 6(c). In this case, the heat produced in the package structure 600 is directly dissipated through the thermal conduction due to the direct contact between the electronic component 60 and the substrate 650 as well as the high thermal conduction characteristic of the metal, as shown in FIG. 6(c). Accordingly, the thermal enhancement for the electronic package structure is further improved, such that a superior thermal dissipation therefor is hence achievable.

The mentioned embodiments are illustrated for expounding the aspects and variations of the present invention, where the configuration for the electronic components inside the package structure is variable dependently on the actual demands. For example, a 2D package structure as well as a 3D package structure would be fabricated through performing the lamination process on multiple dielectric layers, leadframe-like carriers and electronic components. That is to say, the present invention is also applied for efficiently integrating various dies in a limited space, and accordingly, the package structure with multiple layers and various functions can be fabricated easily thereby.

Please refer to FIGS. 7 and 7(*a*) to 7(*c*), which are diagrams illustrating the metallization layer and the leadframe-like carrier configured in the package structure according to the present invention. In the present invention, a plurality of second recesses 725 are pre-formed on the metallization layer or the lead carrier 72 by means of punching, etching or half etching, on which the electronic component 70 is placed correspondingly, so as to prevent the electronic component 70 from moving off the position under a surrounding disturbance. In this case, the undesired movement of the electronic component 70 is avoidable, and the total height of the fabricated package structure is also reduced, so that the miniaturization and the performance enhancement therefore are achieved.

Furthermore, as shown in FIG. 7(*c*), the electronic component 70 is preferably connected to the lead carrier 72 through the wiring 724 by means of wire bonding, so that the connection therebetween is further stabilized and the wiring 724 may be directly extended over the package structure 700 for serving as a lead I/O 726, which also improves the electrical connection to a further electronic device.

In the present invention, the dielectric layer is adopted for the moldering material for package, and the electronic component to be packaged is embedded therein by performing the lamination process thereon, so as to provide the functionalities of electricity conducting, signal transferring, thermal dissipating and circuitry protecting. In addition to the dielectric layer mentioned above, the RCC substrate, the ABF substrate and the flexible substrate made of an organic material, such as the polyimide (PI), the polydimethylsiloxane (PDMS), the liquid crystal polymer (LCP) and the polyethylene terephthalate are also applicable. Certainly, the electronic device fabricated from such a flexible organic substrate will exhibit a good flexibility and are able to be applied more extensively.

Besides, there are also various electronic components applicable in the present invention. In addition to the mentioned die, other known active electronic components or passive electronic components are also individually or combinatively applied in the package structure of the present invention. For example, the typical active electronic component may be a semiconductor, a transistor and an IC. On the other hand, the typical passive electronic component may be a capacitor, a resistor and an inductor which refer to the discrete passive component. Furthermore, a built-in passive component made of a capacitance material, a resistance material or an inductance material is also applied.

Compared with the BGA (ball grid array) technique, which has a great value for the electronic package technology, the through hole and the core layer are not needed anymore in the package structure of the present invention. Therefore, the provided package structure of the present invention is miniaturized due to a smaller PKG (packaging) size. In addition, since the electronic component is embedded between the two substrates by means of the lamination process, the I/O path length of the provided package structure is reduced, so that the electric performance thereof is efficiently improved.

On the other hand, through the adoption of metallization layer as well as the leadframe-like carrier, a thermal enhanced low profile package structure is provided in the present invention. Owing to the excellent thermal conduction characteristic of metal, the heat produced upon operation of the electronic component would be directly dissipated through the adopted metallization layer or the leadframe-like carrier, so that the efficiency of thermal dissipation for the electronic device is sufficiently improved. In addition, the fabrication for such package structure is more simplified and suitable for various substrates, which are commonly used at present.

Based on the above, the present invention provides a novel thermal enhanced low profile package structure and an improved fabrication method therefor. The thermal enhanced low profile package structure is miniaturized, and has an excellent performance and an excellent ability for thermal dissipation. Therefore, the present invention not only has a novelty and a progressiveness, but also has an industry utility.

While the invention has been described in terms of what is presently considered to be the most practical and preferred embodiment, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating an electronic package structure comprising steps of:
   (a) providing a first dielectric layer;
   (b) providing a leadframe-like carrier on said first dielectric layer, wherein said leadframe-like carrier comprises plural channels formed thereon for dividing said leadframe-like carrier into plural lead carriers;
   (c) providing an electronic component on one of said lead carriers;
   (d) providing a second dielectric layer on said electronic component and comprising plural first recesses formed thereon so that said first dielectric layer and said electronic component are covered therewith and a sandwich structure is formed thereby, wherein said leadframe-like carrier further comprises plural second recesses formed thereon and said electronic component is located in one of said second recesses being correspondingly to one of said first recesses;
   (e) performing a lamination process on said sandwich structure, so that said electronic component is embedded therein;
   (f) forming plural conductive members on said sandwich structure, wherein said conductive members pass through said second dielectric layer and are connected to said electronic component; and
   (g) patterning said sandwich structure.

2. The method according to claim 1, wherein after said step (b), further comprising a step of:
   (b1) forming said plural second recesses on said respective lead carriers.

3. The method according to claim 2, wherein said second recesses are formed on said respective lead carriers by one of a punching process and an etching process in said step (b1).

4. The method according to claim 1, wherein said second dielectric layer is provided on said electronic component by a build-up process in said step (d).

5. The method according to claim 1, after said step (g) further comprising a step of:

performing a solder mask process on said sandwich structure.

6. The method according to claim 1, after said step (g) further comprising a step of:

performing a ball-mounting process on said sandwich structure.

7. The method according to claim 1, further comprising a step of:

singulating said sandwich structure into said electronic package structure.

8. The method according to claim 1, wherein each of said first dielectric layer and said second dielectric layer is one selected from a group consisting of a resin coated copper-foil substrate, an ajinomoto build-up film substrate and a flexible substrate.

9. A method for fabricating an electronic package structure comprising steps of:

(a) providing a first dielectric layer;

(b) providing a leadframe-like carrier on said first dielectric layer, wherein said leadframe-like carrier comprises plural channels formed thereon for dividing said leadframe-like carrier into plural lead carriers;

(c) providing an electronic component on one of said lead carriers, wherein said leadframe-like carrier has a thickened portion corresponding to said electronic component;

(d) providing a second dielectric layer on said electronic component so that said first dielectric layer and said electronic component are covered therewith and a sandwich structure is formed thereby;

(e) performing a lamination process on said sandwich structure, so that said electronic component is embedded therein;

(f) forming plural conductive members on said sandwich structure, wherein said conductive members pass through said second dielectric layer and are connected to said electronic component; and (g) patterning said sandwich structure.

\* \* \* \* \*